United States Patent [19]

Martin

[11] Patent Number: 5,833,752
[45] Date of Patent: Nov. 10, 1998

[54] MANIFOLD SYSTEM

[75] Inventor: David Alan Martin, Raleigh, N.C.

[73] Assignee: Becton, Dickinson & Company, Franklin Lakes, N.J.

[21] Appl. No.: 907,354

[22] Filed: Aug. 7, 1997

Related U.S. Application Data

[63] Continuation of Ser. No. 593,975, Jan. 30, 1996, Pat. No. 5,702,770.

[51] Int. Cl.$^6$ .................................................. C23C 16/00
[52] U.S. Cl. .................. 118/723 VE; 118/50.1; 118/723 E; 118/723 I
[58] Field of Search .................... 118/723 VE, 723 E, 118/723 I, 50.1

*Primary Examiner*—Bernard Pianalto
*Attorney, Agent, or Firm*—Nanette S. Thomas

[57] ABSTRACT

An apparatus for facilitating plasma processing and in particular chemical plasma enhanced vapor deposition, plasma polymerization or plasma treatment of barrier materials onto the interior surface of containers barrier materials are useful for providing an effective barrier against gas and/or water permeability in containers and for extending shelf-life of containers, especially plastic evacuated blood collection devices.

4 Claims, 4 Drawing Sheets

MANIFOLD SYSTEM

This is a continuation of application Ser. No. 08/593,975, filed Jan. 30, 1996, U.S. Pat. No. 5,702,770.

BACKGROUND OF THE INVENTION

1. Field of the Invention

This invention relates to an apparatus and method for facilitating plasma processing and in particular chemical plasma enhanced vapor deposition, plasma polymerization or plasma treatment of barrier materials onto the interior surface of containers for providing an effective barrier against gas and/or water permeability

2. Description of the Related Art

Plastic containers frequently do not have the chemical and physical attributes for proper storage and/or handling of their intended contents, and so the plastic surface may be chemically modified or coated with a film that corrects these deficiencies and thereby adds value to the original plastic container. Examples of container attributes include barrier to gas and/or water vapor permeation and reactivity of surface with contents.

Of particular interest is plastic medical products such as evacuated blood collection tubes, syringes or specimen collection containers.

Evacuated plastic tubes are permeable to atmospheric gases and water vapor, and substantially lose vacuum over time. A consequence of lost vacuum is reduced draw volume and blood-to-additive ratio. Thus, there is need to improve the barrier properties of plastic tubes wherein certain performance standards would be met.

Methods for improving barrier properties of plastic containers include deposition of metals and metal oxide thin films from a vacuum deposition source such as plasma chemical vapor deposition, plasma polymerization, plasma sputtering, etc. The usual method of applying plasma deposition coatings or modifications to plastic containers has been to place the container or containers in a vacuum chamber containing low pressure process gases and electrodes for energizing a plasma. In most cases these processes apply the coating to the outside surfaces of the containers.

Therefore, a need exists for an improved method and apparatus for imparting a coating inside the surfaces of containers.

SUMMARY OF THE INVENTION

The present invention is an apparatus and method for applying a barrier film coating or treatment to the interior wall surfaces of plastic containers by means of plasma processing. Such coatings and treatments may substantially improve barrier properties of containers and the surface reactivity of the containers.

Desirably, the barrier film coating comprises a silicon oxide composition, such as $SiO_x$, where the number ratio of oxygen atoms to silicon atoms, x, is about 1.5 to about 2.0.

The preferred apparatus of the present invention comprises means for delivering reactant gases at vacuum conditions to the inner volume of a plastic container and means for applying and imparting energy inside the container to energize or induce the reactant gases into plasma so as to apply a barrier film on the interior wall surface of the plastic container.

Preferably, the apparatus for plasma processing the interior wall surface of a container comprises a manifold system to which the inner area of the container is connected and/or exposed to. The manifold system preferably comprises means for delivering reactant gases to the container and means for creating and maintaining a vacuum in the container during processing. The apparatus further includes means for imparting energy inside the container so as to generate a plasma.

Preferably, the means for delivering reactant gases to the container comprises a monomer source, an oxider source and an optional diluent gas source.

Preferably, the means for creating and maintaining a vacuum in the container during processing is a vacuum pump.

Preferably, the means for generating the plasma includes electrodes and an energy source.

Therefore, the method of applying a barrier film coating to the interior wall surface of a container comprises the following steps:

(a) positioning the open end of the container to the vacuum manifold system;

(b) positioning the external surface of the container with means for imparting energy inside the container;

(c) evacuating the container;

(d) adding reactant gases into the container;

(e) imparting energy inside the container; and (f) generating a plasma inside the container and thus applying a barrier film coating to the interior wall surface of the container.

Optionally, the method steps may be repeated so as to assure that the barrier film coating is uniformly applied throughout the inside of the container or to apply a second barrier film coating.

Optionally, the interior wall surface of the container may be chemically modified or pre-coated with a non-barrier coating. The non-barrier coating may substantially enhance, stabilize and smooth the interior wall surface of the container so as to improve the adhesion of the barrier coating to the interior wall surface.

Another option of the present invention is to apply a top-coat to the previously applied barrier film coating. A top-coat substantially protects the barrier film coating and imparts a surface chemistry for enhanced performance of the final product, such as to inhibit or to enhance surface reactions with the anticipated contents of the container in use.

Preferably, the monomer source is an organosilicon component such as hexamethyldisiloxane, (HMDSO), tetraethoxysilane (TEOS) or tetramethylsilane (TMS).

Preferably, the oxidizer source is air, oxygen or nitrous oxide.

Preferably, the diluent gas source is an inert gas, such as helium, argon or a non-reactive gas such as nitrogen.

Preferably, the electrodes are inductively or capactively coupled metallic electrodes in the form of coils, pointed rods or flat or curved plates. Most preferably, the electrodes are energized with an energy source such as low frequency alternating current (AC), radio frequency (RF) or microwave frequency electrical potentials, either continuous or pulsed.

Most preferably, the method of applying a barrier coating to the interior wall surface of a container comprises the following steps:

(a) positioning the open end of the container to the vacuum manifold system;

(b) positioning the external surface of the container with electrodes that are connected to an energy source;

(c) maintaining a pressure of about 300 mTorr inside the container by evacuating the container with the vacuum pump;

(d) controllably flowing an organosilicon component with an oxidizer component and an optional inert gas component through the manifold system and into the container;

(e) energizing the electrodes so as to impart energy to the components inside the container;

(f) establishing a glow discharge plasma inside the container; and (g) depositing a barrier film coating onto the interior wall surface of the container.

Preferably, the method steps may be repeated wherein the electrodes in step (b) are repositioned on the external surface of the container.

Alternatively, the method steps may be repeated wherein the electrodes in step (b) are turned off and on and/or the flow of components in step (d) are turned off and on so as to pulse the plasma energy or component flow or both so as to enhance the barrier properties.

Therefore, the alternate method steps may be as follows:

(h) de-energizing the electrodes; and (i) energizing the electrodes so as to impart energy.

Another alternate method may be as follows:

(h) stopping the flow of components in step (d); and (i) then again controllably flowing the components as in step (d).

A further alternate method may be as follows:

(h) stopping the flow of components in step (d);

(i) de-energizing the electrodes in step (e); and (j) then repeating steps (d)–(g).

Both the placement of the coating on the interior wall surface of the container and the method of using the container as its own vacuum treatment chamber has many notable features and advantages over the prior methods of applying coatings on the outer surfaces of containers while inside a vacuum chamber.

A notable feature of the present invention is that the container acts as its own individual vacuum chamber, wherein plasma induced or enhanced reactions take place with the resulting modification of, or deposition on, the interior wall surface of the container. The apparatus and method of the present invention does not require a vacuum chamber. A vacuum chamber as is used in most deposition processes, requires significant process space and control.

The present invention increases the efficiency of manufacturing. The invention allows in-line processing on each individual container, as opposed to the usual method of batch processing of many containers. Large batch processing chambers require longer pump-down times both due to the increased chamber volume and de-gassing the chamber. Therefore, with the present invention, loading and unloading of containers into and out of a batch processing chamber is eliminated.

An important feature of the present invention is that the barrier film coating on the interior wall surface of the container is substantially protected from physical damage. When the barrier film coating is on the outside of the container, which is the usual case, it is subject to abrasive damage due to handling during manufacture, shipping, or by the end user. Therefore, a barrier film coating on the interior wall surface of the container, improves the effectiveness of the shelf-life of the container because damage to the barrier film coating is substantially reduced.

A further feature of the present invention is that the barrier film coating on the interior wall surface is of substantially higher quality than a barrier film coating on the outside wall of the container. This is due to the fact that the interior wall surface of the container is less likely to be subject to contact contamination, such as oils, greases and dust as is the outside of the container during manufacture. Such contaminations on the walls of the container could cause coating non-uniformity, defects, and poor adhesion. No cleaning of accumulated coatings or particulates is required for the inside of the container, since each container to be coated is a new treatment "chamber." In addition, since the means for imparting energy inside the container is external, it is not subject to coating accumulation that can change its electrical characteristics and degrade the process.

Another distinguishing aspect of the present invention is that the means for imparting energy inside the container may be altered, moved and/or rotated on the outside of the container in various locations and positions, to substantially assure uniformity of the barrier film coating. Therefore, "shadowing" during plasma process is not an issue as it is in plasma processing on the outside wall of the container.

Other drawbacks of batch systems wherein processing is on the outside wall of the container, include container "fit" over electrodes and variations in container dimensions, such as "bow". These things are not a problem in the present invention. Furthermore, failure of a large batch processing unit would result in a large loss in productivity, whereas failure of an in-line unit would be a minor loss of capacity if many lines were available (since each line costs less). Due to the simplicity of the in-line process, ruggedness and repairability are improved over the alternative batch process. It is believed that containers could be in-line processed by this invention without ever stopping movement along the line.

A further advantage of the present invention is that since the means for imparting energy inside the container is external to the container, such apparatus is easily and inexpensively altered. This allows tailoring a production line to specific requirements, by easily altering such apparatus as the electrodes, in conjunction with altering the reactant gases. This would allow a single line to process different container configurations with only minor changes in the production line.

Most preferably, the container of the present invention is a blood collection device. The blood collection device can be either an evacuated blood collection tube or a non-evacuated blood collection tube. The blood collection tube is desirably made of polyethyleneterephthalate, polypropylene, polyethylene napthalate or copolymers thereof.

Plastic tubes coated on the interior wall surface with the barrier film coating are able to maintain substantially far better vacuum retention, draw volume and thermomechanical integrity retention than plastic tubes comprised of polymer compositions and blends thereof with a barrier film coating on the external wall surface of the tube. In addition, the tube's resistance to impact is substantially much better than that of glass.

Most notably is the clarity of the barrier film coating and its durability to substantially withstand resistance to impact and abrasion. Therefore, a plastic blood collection tube coated with the barrier film coating is capable of being subjected to automated machinery such as centrifuges and may be exposed to certain levels of radiation in the sterilization process.

DETAILED DESCRIPTION

The present invention may be embodied in other specific forms and is not limited to any specific embodiment described in detail which is merely exemplary. Various other modifications will be apparent to and readily made by those skilled in the art without departing from the scope and spirit of the invention. The scope of the invention will be measured by the appended claims and their equivalents.

Figure 1:
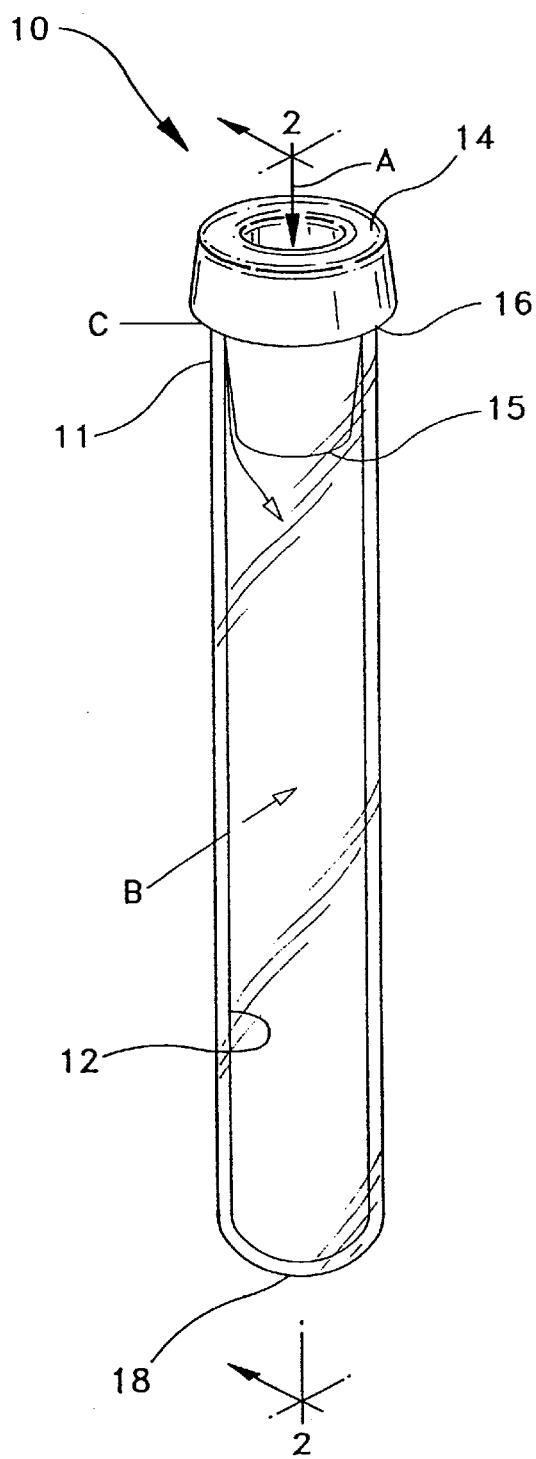
FIG. 1 is a perspective view of a typical blood collection tube with a stopper.
Figure 2:
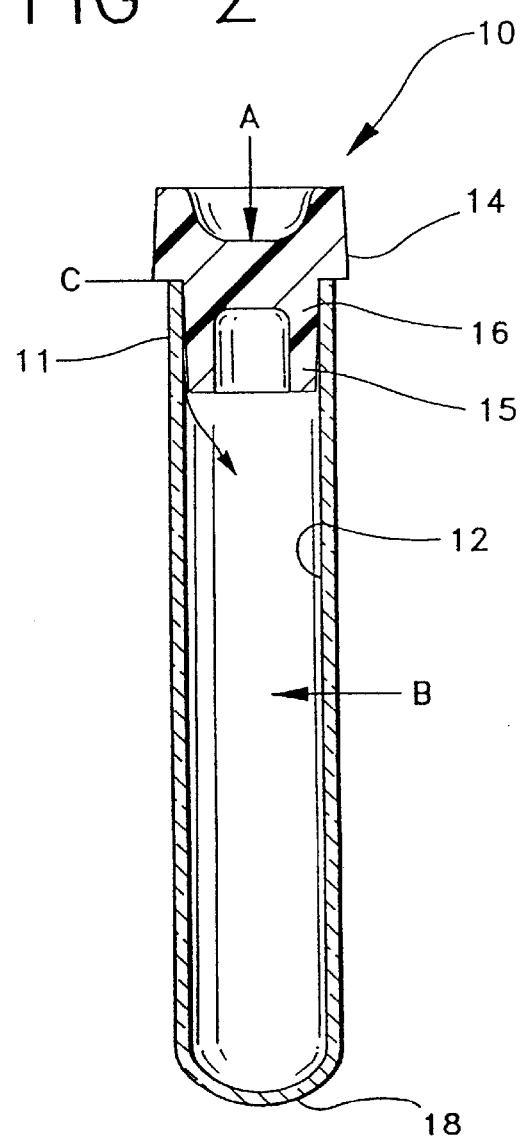
FIG. 2 is a longitudinal sectional view of the tube of FIG. 1 taken along line 2—2.

Referring to the drawings in which like reference characters refer to like parts throughout the several views thereof, FIGS. 1 and 2 show a typical blood collection tube 10, having a sidewall 11 extending from an open end 16 to a closed end 18 and a stopper 14 which includes a lower annular portion or skirt 15 which extends into and presses against the inner surface 12 of the sidewall for maintaining stopper 14 in place.

FIG. 2 schematically illustrates that there are three mechanisms for a change in vacuum in a blood collection tube: (A) gas permeation through the stopper material; (B) gas permeation through the tube and (C) leak at the stopper tube interface. Therefore, when there is substantially no gas permeation and no leak, there is good vacuum retention and good draw volume retention.

Figure 3:
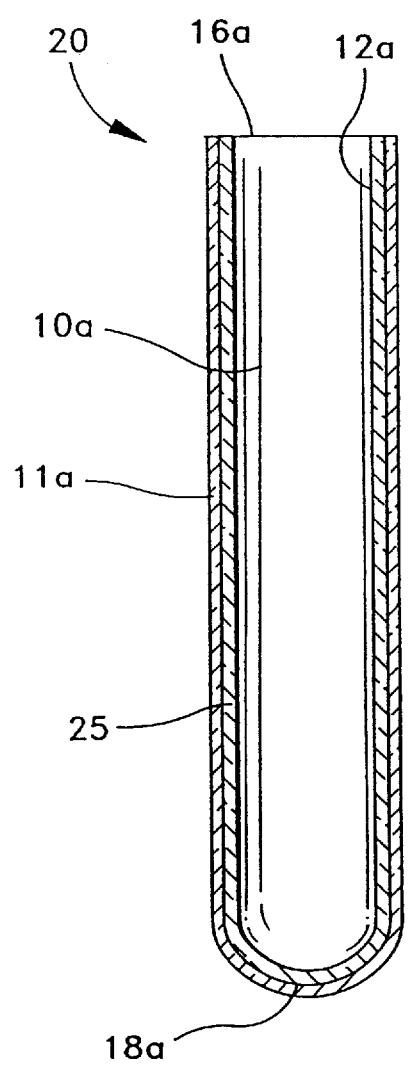
FIG. 3 is a longitudinal sectional view of a tube-shaped container similar to the tube of FIG. 1 without a stopper, comprising a barrier coating.

FIG. 3 shows the preferred embodiment of the invention, a plastic tube coated with at least one layer of a barrier material. The preferred embodiment includes many components which are substantially identical to the components of FIGS. 1 and 2. Accordingly, similar components performing similar functions will be numbered identically to those components of FIGS. 1 and 2, except that a suffix "a" will be used to identify those components in FIG. 3.

Referring now to FIG. 3, the preferred embodiment of the invention, collection tube assembly 20 comprises a plastic tube 10a, having a sidewall 11a extending from an opened end 16a to a closed end 18a. A barrier coating 25 extends over a substantial portion of the inner surface of the tube with the exception of open end 16a.

The barrier coating of the present invention is deposited from a plasma that is generated inside the tube from one or more particular reactant gas stream components. Desirably, the reactive gases include a monomer gas component and an oxidizer gas component. The tube is positioned with a vacuum manifold system, that provides the reactive gas components controllably flowed into the inside of the tube. An external energy source to the tube energizes the gas streams so as to deposit a barrier coating on the inside wall of the tube.

The deposition method of the present invention is carried out at a pressure of about 70 mTorr to about 2000 mTorr in the manifold system during the deposition, and preferably the inside of the tube is at a pressure between about 70 mTorr to about 2000 mTorr during the deposition of the barrier coating.

The substrate is about at room temperature of about 25° C. during the depositing process. That is, the substrate is not deliberately heated during the deposition process.

Figure 4:
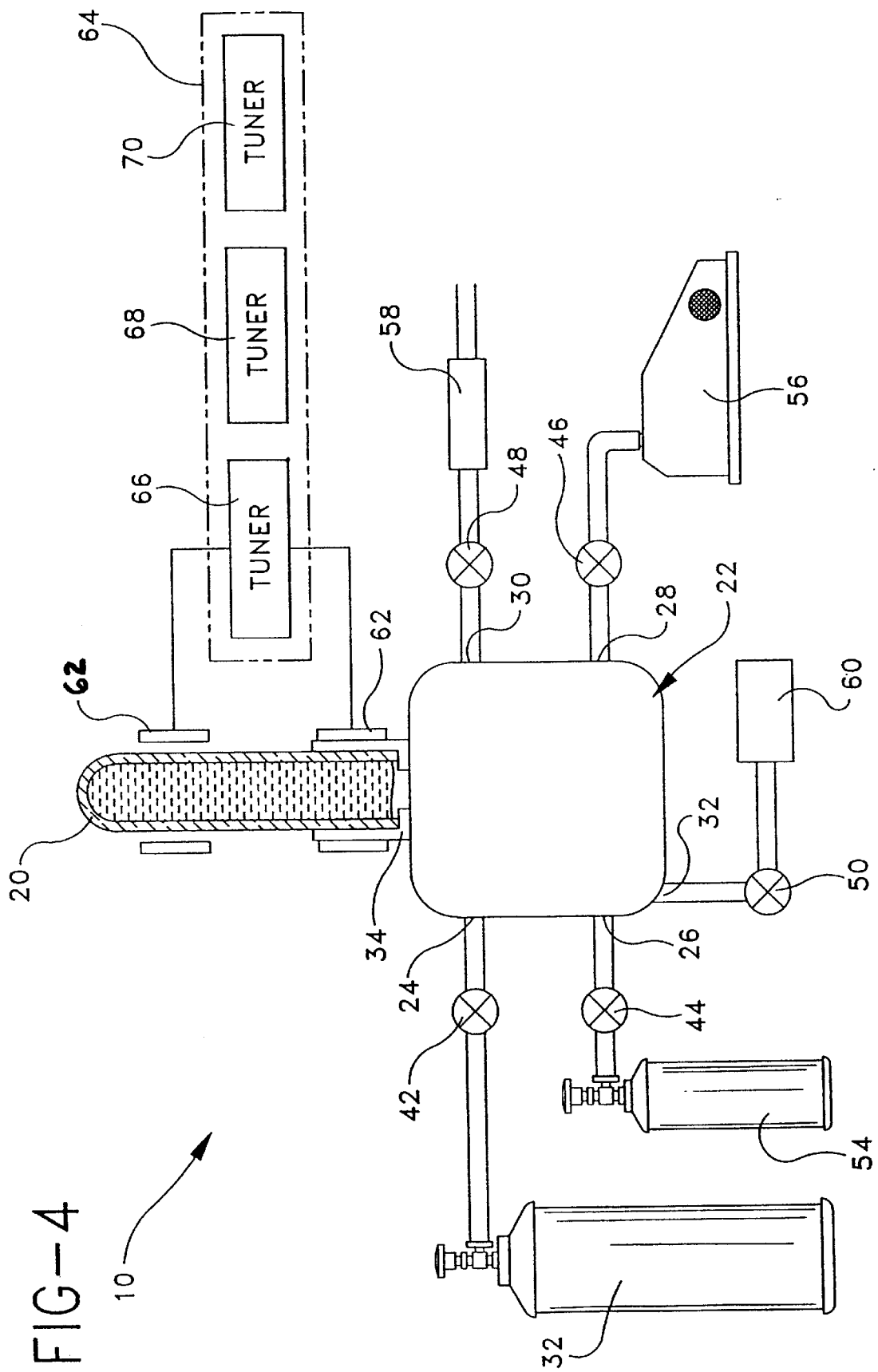
FIG. 4 is a general schematic diagram illustrating the apparatus for plasma generation of the present invention.

Referring to FIG. 4, an apparatus of the present invention includes a vacuum manifold system 22. The vacuum manifold system includes at least five connections 24, 26, 28, 30 and 32 and a coupling port 34 that is desirably a rubber grommet.

Connections 24, 26, 28, 30 and 32 lead to isolation gate valves 42, 44, 46, 48 and 50 respectively. Valves 42, 44, 46, 48 and 50 lead respectively to a monomer gas source 52, an oxidizer gas source 54, a vacuum pump 56, a vent filter 58 and a diluent gas source 60 respectively. The apparatus further includes means for creating energy including an external electrode system 62 and an energy source 64. The energy source preferably includes a tuner 66, an amplifier 68 and an oscillator 70.

After the tube has been fabricated by any suitable plastic tube forming method, such as injection molding, extrusion with end-capping, blow molding, injection blow molding, etc., the open end of the tube is first connected to the vacuum manifold system at the coupling port and all valves are in a closed position. Then valve 46 is opened and the vacuum pump is initiated to reduce the pressure in the tube to the vacuum region of about 0.001 mTorr to about 100 mTorr.

The reactant gas components necessary for the plasma to form inside the tube are then introduced by way of the manifold system into the tube. Valve 42 is first opened so that the monomer gas component flows into the manifold system at a pressure of about 125 mTorr, a flow rate of about 1.0 sccm, and a room temperature of about 74° F. Then valve 44 is opened so that the oxidizer gas component flows into the manifold system at a pressure of about 175 mTorr, flow rate of about 22 sccm and a temperature of about room temperature or about 74° F.

The monomer gas component and the oxidizer gas component are preferably admixed with the inert gas component in the manifold system before being flowed into the tube. The quantities of these gases being so admixed are controlled by flow controllers so as to adjustably control the flow rate ratio of the reactant gas stream components. The mixture of the reactant gas components is achieved inside the tube prior to energizing the electrical system.

Most preferably, the monomer gas component is preferably HMDSO and the oxidizer gas component is preferably oxygen so as to form and deposit a barrier coating of silicone oxide ($SiO_x$) on the internal wall surface of a tube.

The barrier coating is deposited on the internal surface of the tube to a desired thickness. The thickness of the coating is about 500 Angstroms (Å) to about 5000 Å. Most preferably, the thickness of the oxide coating is about 1000 Å to about 3000 Å.

Optionally, a general control system including a computer control portion, is connected to each of the components of the system in a manner to receive status information from and send controlling commands to them.

Suitable pressure of the reactant gas mixture is between about 70 mTorr and about 2000 mTorr, preferably between about 150 mTorr and 600 mTorr and most preferably about 300 mTorr.

Desirably, an organosilicon such as HMDSO is used as the monomer gas component at a flow rate of about 0.1 to 50 sccm, at 25° C. and from about 80 mTorr to about 190 mTorr preferably at about 0.5 sccm to about 15 sccm and most preferably at about 1.0 sccm.

Desirably, air is used as the oxidizer gas component at a flow rate of about 0.1 to about 50 sccm, (at 25° C.) and from about 110 mTorr to about 200 mTorr, preferably at about 15 to about 35 sccm and most preferably at about 22 sccm.

Reactive gases such as oxygen, $F_2$, $C_{12}$, $SO_2$ or $N_2O$ may be used as pre- or post- treatments so as to react with the barrier coating precursors.

Preferably, the oxidizer source is air, oxygen or nitrous oxygen.

Preferably, the diluent gas source is an inert gas, such as helium, argon or a non-reactive gas such as nitrogen.

Examples of suitable organosilicon compounds are liquid or gas at about ambient temperature and have a boiling point about 0° C. to about 200° C. and include tetramethyltin, tetraethyltin, tetraisopropyltin, tetraallyltin, dimethysilane, trimethylsilane, diethylsilane, propylsilane, phenylsilane, hexamethyldisilane, 1,1,2,2-tetramethyldisilane, bis (trimethylsilane)methane, bis (dimethylsilyl) methane, hexamethyldisiloxane, vinyl trimethoxy silane, vinyl triethyoxysilane, ethylmethoxysilane, ethyltrimethoxysilane, divinyltetramethyldisiloxane, hexamethyldsilazane divinyl-hexamethyltrisiloxane, trivinylpentamethyltrisiloxazane, tetraethoxysilane and tetramethoxysilane.

Among the preferred organosilicons are 1,1,3,3-tetramethyldisiloxane, trimethylsilane, hexamethyldisiloxane, vinyltrimethylsilane, methyltrimethoxysilane, vinyltrimethoxysilane and hexamethyldisilazane. These preferred organosilicon compounds have boiling points of 71° C., 55.5° C., 102° C., 123° C. and 127° C. respectively.

The optional diluent gas of the gas stream preferably is helium, argon or nitrogen. The non-reactive gas may be used for dilution of the reactive gases.

The specific gases or mixtures could be barrier coating precursors like siloxanes or silanes for an $SiO_x$ barrier, methane, hexane, etc. for polymerization of hydrocarbon or diamond-like coatings.

Figure 5:
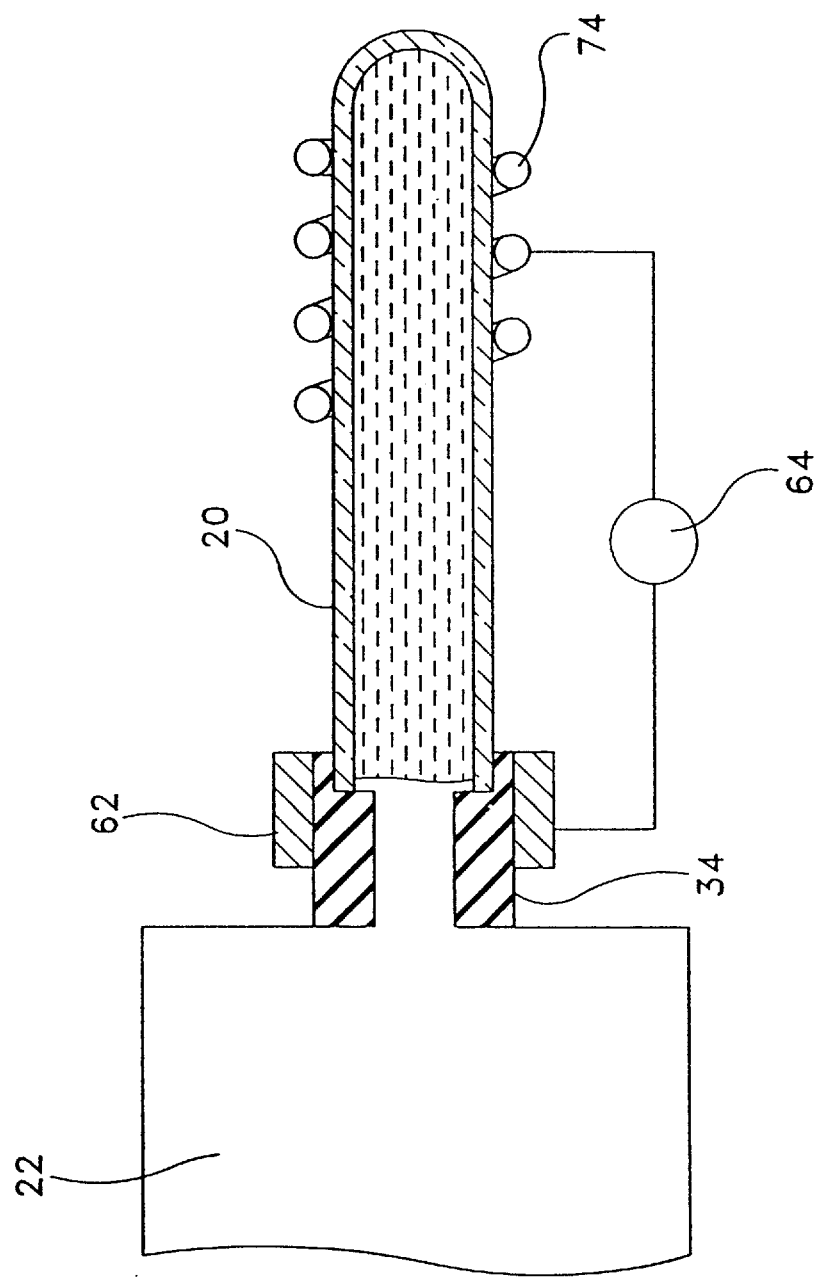
FIG. 5 is a schematic diagram illustrating a tube connected to the apparatus of FIG. 4 and a coil electrode.

The energy to create a plasma inside the tube for beneficial reactions to take place with the reactant gases is provided through electrodes external to the tube, by means of inductively or capacitively coupled metallic electrodes in the form of coils, pointed rods, flat or curved plates, rings or cylinders. Flat plates 62 are illustrated in FIG. 4 and a coil 74 is illustrated in FIG. 5.

Preferably, the electrodes are energized with an energy source that may be low frequency alternating current (AC), radio frequency (RF), or microwave frequency electrical potentials, either continuous or pulsed.

Most preferably, the electrodes are energized by RF power supply of desirably about 5 watts to about 150 watts, preferably from about 15 watts to about 40 watts and most preferably at about 20 watts.

The result is the electrical breakdown and ionization of the process gases inside the tube, i.e., a plasma is created inside each individual tube. The plasma is energized from 1 second to 20 minutes, preferably 5 seconds to 2 minutes. The condensation and chemical reaction of the treatment gases produce the desired coating or modification to the containing tube walls. The substrate can be any vacuum compatible material, such as plastic.

A variation in the method of this invention is to coat the inside of a container with a liquid layer by any of several methods, such as dip coating, spin coating, spray coating, or solvent coating, and then use a suitable plasma generated by this method to cross-link or cure the liquid so that it becomes a solid, semi-solid, or gel coating.

Various optical methods known in the art may be used to determine the thickness of the deposited film while in the deposition chamber, or the film thickness can be determined after the article is removed from the deposition chamber.

A variety of substrates can be coated with a barrier composition by the process of the present invention. Such substrates include, but are not limited to packaging, containers, bottles, jars, tubes and medical devices.

A variety of processes are also available in addition to plasma deposition for depositing a barrier composition. Such processes include, but are not limited to radio frequency discharge, direct or dual ion beam deposition, sputtering, or evaporation.

Various other modifications will be apparent to and may be readily made by those skilled in the art without departing from the scope and spirit of the invention.

The following examples are not limited to any specific embodiment of the invention, but are only exemplary.

EXAMPLE 1

A polypropylene (PP) tube was connected to the vacuum manifold system and with external parallel plate electrodes surrounding the outside of the tube. A vacuum of about 60 mTorr was first drawn inside the tube. Then air at about 400 m Torr was introduced into the tube through the manifold system and the electrodes were energized at 30 watts from a 38 MHz oscillator for about 30 seconds to provide a surface activation treatment. While the plasma was energized, a monomer gas of hexamethyldisilxane vapor was added into the tube through the manifold until the total pressure of the gas mixture was about 725 mTorr. The plasma deposition was maintained for about 1 minute, followed by a 30 second air treatment.

After $SiO_x$ was deposited on the interior wall surface of the tube, the tube was disconnected from the manifold. The permeance performance results of the tube are reported in Table 1.

EXAMPLE 2

A PP tube was connected to the vacuum manifold system and to external parallel plate electrodes surrounding the outside of the tube. A vacuum of about 60 mTorr was first drawn inside the tube. Then air was introduced into the tube at a pressure of about 600 mTorr. Then hexamethyldisiloxane vapor was introduced into the tube until the total pressure of the gas mixture inside the tube was about 1.0 Torr. The electrodes were energized at 38 MHz and 22 Watts for about 2 minutes so that a plasma of $SiO_x$ was generated inside the tube.

After $SiO_x$ was deposited on the interior wall of the tube, the tube was disconnected from the manifold. The permeance performance results of the tube is reported in Table 1.

EXAMPLE 3

A polyethyleneterphthalate (PET) tube was connected to the vacuum manifold system and to external parallel plate electrodes surrounding the outside of the tube. A vacuum of about 65 mTorr was first drawn inside the tube. Then air was introduced into the tube at a pressure of about 600 mTorr. Then hexamethyldisiloxane vapor was introduced into the tube until the total pressure of the gas mixture inside the tube was about 1.0 Torr. The electrodes were energized at 38 MHz and 22 watts for about 2 minutes so that a plasma of $SiO_x$ was generated inside the tube.

After $SiO_x$ was deposited on the interior wall surface of the tube, the tube was disconnected from the manifold. The permeance performance results of the tube is reported in Table 1.

EXAMPLE 4

A PET tube was connected to the vacuum manifold system and to external flat plate electrodes with ends curved around the closed end of the tube. A vacuum of about 65 mTorr was first drawn inside the tube. Then oxygen was introduced into the tube at a pressure of about 300 mTorr. Then hexaethyldisiloxane vapor was introduced until the total pressure inside the tube was about 400 mTorr. The electrodes were energized at 38.5 MHz and 22 Watts for about 5 minutes and a plasma was created inside the tube.

After $SiO_x$ was deposited on the interior wall surface of the tube, the tube was disconnected from the manifold. The permeance performance results of the tube is reported in Table 1.

EXAMPLE 5

A tube made of PP was connected to the vacuum manifold system and to external flat plate electrodes with ends curved around the closed end of the tube. A vacuum of about 65 mTorr was first drawn inside the tube. Then oxygen was introduced into the tube at a pressure of about 400 mTorr. Then hexamethyldisiloxane was introduced into the tube until the total pressure inside the tube of the gas mixture was about 750 mTorr. The electrodes were then energized at 38.5 MHz and 22 Watts and a plasma was created inside the tube for about 5 minutes and a plasma was created inside the tube.

After $SiO_x$ was deposited on the interior wall surface of the tube, the tube was disconnected from the manifold. The permeance performance results of the tube is reported in Table 1.

EXAMPLE 6

A tube made of PP was connected to the vacuum manifold system and to external flat plate electrodes with ends curved around the closed end of the tube. A vacuum of about 65 mTorr was first drawn inside the tube. Then oxygen was introduced into the tube at a pressure of about 400 mTorr. Then hexamethyldisiloxane was introduced into the tube until the total pressure inside the tube was 700 mTorr. The electrodes were then energized at 38.5 MHz at 22 watts for about 2.5 minutes and a plasma was created inside the tube.

The tube was then rotated about 90 degrees about its axis while still under vacuum and the electrodes were again energized at 38.5 MHz at 22 watts for another 2.5 minutes.

After $SiO_x$ was deposited on the interior wall of the tube, the tube was disconnected from the manifold. The permeance performance results of the tube is reported in Table 1.

EXAMPLE 7

A PP tube was connected to the vacuum manifold system and to a coil electrode encircling the closed end of the tube and a band electrode encircling the open end of the tube. A vacuum was first drawn inside the tube. Then air was introduced into the tube at a pressure of about 200 mTorr. The electrodes were then energized at 11.7 MHz and 62 Watts for about 30 seconds and a plasma of air oxidized the inside the tube so as to increase surface energy for enhancing spreading of liquid.

The tube was then disconnected from the vacuum manifold and the interior of the tube was coated with a 1% solution of tripropylene glycol diacrylate in trichlorotrifluorethane solvent. The solvent was then evaporated leaving the diacrylate coating inside the tube. The tube was then reconnected to the vacuum manifold and the electrodes. The diacrylate coating was then crosslinked in place by a 2 minute air plasma treatment at about 150 mTorr inside the tube at the same power, frequency, and electrodes as above.

Then air was introduced into the tube at a pressure of about 150 mTorr.

Then hexaethyldisiloxane vapor was introduced until the total pressure inside the tube was about 250 mTorr. Then the electrodes were energized at 11.7 MHz and 62 watts for about 3 minutes and a plasma was created inside the tube.

The plasma of the hexamethyldisiloxane/air mixture was again created inside the tube three more times so that an $SiO_x$ barrier layer was deposited in four sequential layers.

Then a protective top layer was deposited adjacent the $SiO_x$ barrier layer with plasma polymerized HMDSO. Then hexamethyldisiloxane was introduced into the tube at about 300 mTorr and the electrodes were energized at 11.7 MHz and 62 Watts for about 60 seconds.

EXAMPLE 8

A polystyrene (PS) tube was connected to the vacuum manifold system and to an external coil shaped electrode surrounding the closed end of the tube. A vacuum of about 30 mTorr was first drawn in the tube. Then 22 sccm of air was introduced into the tube through the manifold system at a pressure of about 250 mTorr. Then 1.0 sccm of HMDS vapor was introduced into the tube through the manifold system at a pressure of 50 mTorr so that the total pressure of the gas mixture inside the tube was 300 mTorr. The electrode was then energized at 11 MHz and 20 Watts for about 5 minutes so that a plasma was generated inside the tube.

After $SiO_x$ was deposited on the interior wall surface of the tube, the tube was disconnected from the manifold. The permeance performance results of the tube are reported in Table 1.

TABLE 1

| Example | Oxygen Permeance cc/m²/atm/day |
|---|---|
| PP tube, control uncoated (Example 1) | 55.9 |
| PP tube (Example 1) | 26.1 |
| PP tube, control (Example 2) | 50.0 |
| PP tube (Example 2) | 33.7 |
| PET tube (Example 3) | 1.75 |
| PET tube, control (Example 3) | 2.33 |
| PET tube (Example 4) | 1.47 |
| PET tube, control (Example 4) | 2.33 |
| PP tube, w/out rotation (Example 5) | 32.4 |
| PP tube control w/out rotation (Example 5) | 57.1 |
| PP tube, w/rotation (Example 6) | 25.8 |
| PP tube control w/rotation (Example 6) | 57.1 |
| PP tube, control (Example 7) | 77.1 |
| PP tube, (Example 7) | 4.42 |
| PS tube, control uncoated (Example 8) | 145 |
| PS tube, (Example 8) | 77.3 |

What is claimed is:

1. A manifold system comprising:
   (a) a vacuum manifold;
   (b) at least five connections on said vacuum manifold;
   (c) at least five isolation valves following said connections;
   (d) a monomer gas source;
   (e) an oxidizer gas source;
   (f) a vacuum pump;
   (g) a vent filter;

(h) a diluent gas source;

(i) each isolation valve leading respectively to said monomer gas source, said oxidizer gas source, said vacuum pump, said vent filter and said diluent gas source;

(j) a coupling port on said vacuum manifold;

(k) an electrode system associated with said coupling port; and (l) an energy source connected to said electrode system.

2. The manifold system of claim 1, wherein said energy source comprises a tuner, an amplifier and an oscillator.

3. The manifold system of claim 2, wherein said electrode system is an electrically conductive coil.

4. The manifold system of claim 2, wherein said electrode system are plates.

* * * * *